United States Patent [19]

Kanai et al.

[11] 4,187,729
[45] Feb. 12, 1980

[54] PUSHBUTTON TUNER

[75] Inventors: Takao Kanai; Yashuhisa Nishikawa, both of Toda, Japan

[73] Assignee: Clarion Co., Ltd., Tokyo, Japan

[21] Appl. No.: 859,668

[22] Filed: Dec. 12, 1977

[30] Foreign Application Priority Data

Dec. 16, 1976 [JP] Japan .................................. 51/150293
Dec. 17, 1976 [JP] Japan .................................. 51/168173
Dec. 28, 1976 [JP] Japan .................................. 51/175143
Dec. 28, 1976 [JP] Japan .................................. 51/175144

[51] Int. Cl.² ........................................... F16H 35/18
[52] U.S. Cl. ................................ 74/10.9; 74/10.27; 74/10.29; 74/10.31; 74/10.33; 74/10.35; 74/10.37
[58] Field of Search ................. 74/10.27, 10.29, 10.31, 74/10.33, 10.35, 10.37, 10.9

[56] References Cited

U.S. PATENT DOCUMENTS

| | | | |
|---|---|---|---|
| 3,212,343 | 10/1965 | Clark | 74/10.37 |
| 3,277,729 | 10/1966 | Alfonso | 74/10.33 |
| 3,943,779 | 3/1976 | Ganderton | 74/10.33 |

Primary Examiner—Charles J. Myhre
Assistant Examiner—R. C. Turner
Attorney, Agent, or Firm—Wallenstein, Spangenberg, Hattis & Strampel

[57] ABSTRACT

A pushbutton tuner with its reduced size includes linkage means operatively connected a tuning slider laterally positionable in accordance with the setting of the tuner. A link engaging pin provided on a pushbutton operative member engages with the linkage means upon depression of the pushbutton operative member so as thereby to move the slider depending upon the preset position of the engaging pin.

12 Claims, 14 Drawing Figures

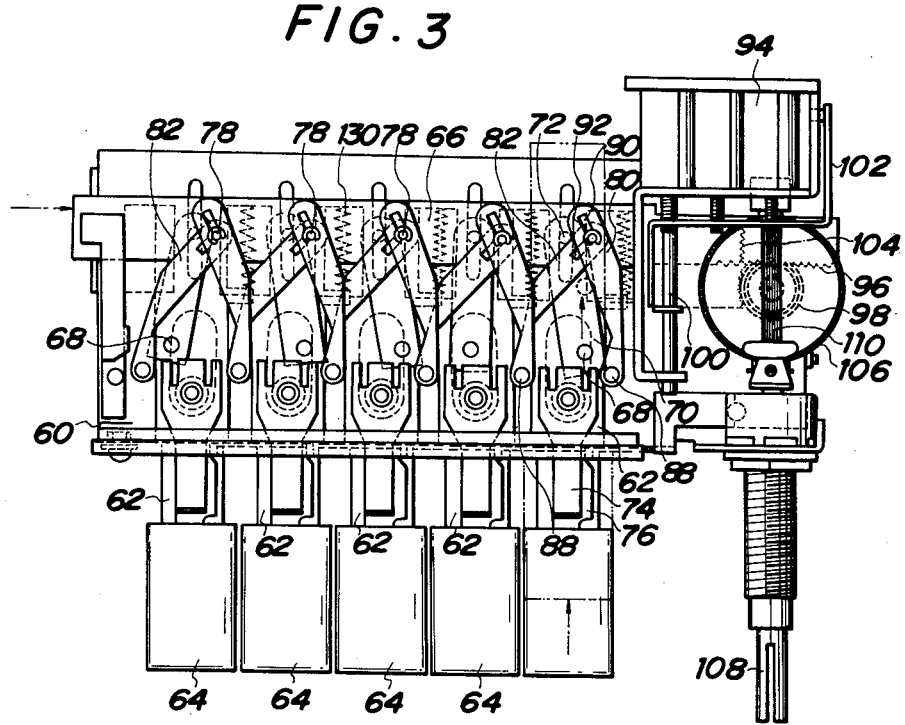

PUSHBUTTON TUNER

BACKGROUND OF THE INVENTION

This invention relates to a pushbutton tuner which may be suitably used for a car radio receiver set. More particularly, it relates to such a tuner having the reduced size of its tuning mechanism.

A pushbutton tuning mechansim essentially comprises (a) operative members each having at its one end a pushbutton and positioned for longitudinal movement from an unoperative position to an operative position in response to the depression of its pushbutton, (b) a tuning slider plate responsive to the movement of the operative member for moving in the direction transversely thereof by the amount peculiar to the respective operative member, and (c) tuning determination means responsive to the movement of the tuning slider plate for providing the corresponding mechanical position of the u-tuning cores with respect to related stational coils to determine the reception frequency point peculiar to the respective pushbutton.

In general, in order to make the tuning mechanism compact in size, it is a common practice to arrange the operative members horizontally with respect to the plane of the tuner. However, since each of the operative members is, generally, provided with a frequency presetting cam plate pivotally mounted thereon to provide a preset amount of movement of the tuning slider plate in cooperation therewith, and a locking plate for fixedly positioning the cam plate at the preset position, it is impossible with such horizontal arrangement of the operative members to provide all pivotal angular positions of the cam plate for the movements of the slider plate corresponding to a sufficient u-tuning core stroke to cover a desired frequency band, unless there are great distances between the adjacent operative members. Therefore, even though a tuner having the thin size in height is obtainable, the resulting width thereof would become great, so that it is impossible to make the whole size of the tuner compact.

In the prior art, there have been many kinds of attempts for accomplishing the thinning and compacting of the tuner simultaneously. For example, in U.S. Pat. No. 2,253,433, a pushbutton tuner is shown wherein operative members arranged horizontally with respect to the plane of the tuner are provided therein V-shaped cutouts respectively. As an operative member is depressed from its unoperative position to the operative position, a pin for the respective operative member provided on the slider operatively coupled to a tuning determination mechanism is moved to a point of the V of the related cutout in the operative member, so that said slider carrying the pins is moved transversely of the moving direction of the operative member. The pins respectively engaging the V-shaped cutouts at the front side of the slider are positioned at presettable positions along said front side so that the tuning frequency point selected by the respective pushbutton is freely presettable. The operative member must have at least such a V-shaped cutout width that make possible to moving the related pin of the slider by the maximum moving distance of the slider within the rear portion of the V-shaped cutout of the operative member which is in the unoperative position. So, in the tuner disclosed in this patent, by arranging the operative members so that the adjacent ones are overlapped with each other up and down with respect to the slider, the spaces therebetween are made narrow, and, thus, the whole size of the tuner is made compact.

Therefore, this invention provides a pushbutton tuner having the reduced size without any deterioration of its operation quality by the new structure of the mechanism thereof over the prior art.

BRIEF DESCRIPTION OF THE DRAWINGS

FIG. 3 is a plan view of a pushbutton tuner of an embodiment of the invention;

FIG. 4 is a view for use of explanation of the most important portion of the tuner in FIG. 3;

DETAILED DESCRIPTION OF THE PREFERRED EMBODIMENTS

Figure 1:
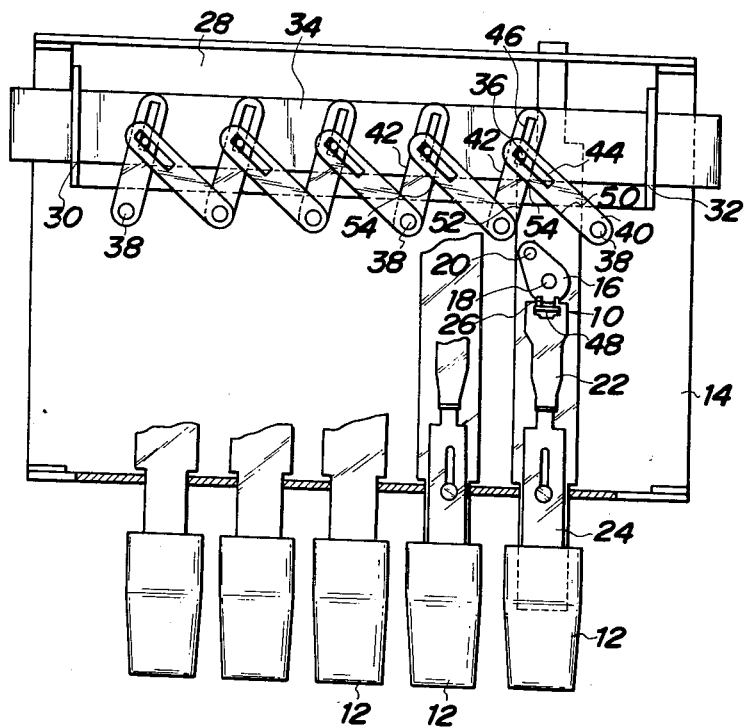
FIGS. 1 and 2 are plan and section views of a pushbutton tuner of a prior invention.
Figure 2:
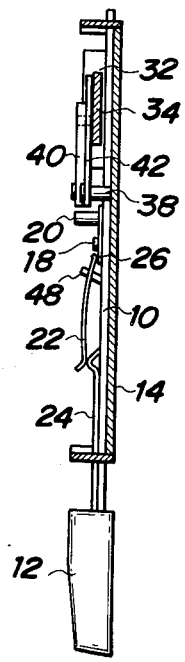

According to FIGS. 1 and 2 which show a prior invention disclosed in copending U.S. application Ser. No. 831,699, an operative member 10 spring biased to a forward position is slidably mounted on a tuner base 14 in parallel relation thereto, and a frequency defining plate 16 is pivotally mounted on the operative member 10 by a pin 18. Each frequency defining plate 16 has one link engaging pin 20. Since the frequency defining plate 16 is mounted on the operative member 10 so as to be parallel thereto, it is also parallel to the tuner base 14. As the Figures show, a plate 22 is provided on each member 10 for clamping or locking the frequency defining plate 16 in an adjusted position on the operative member 10. Also, the member 10 carries a plate 24 attached to a pushbutton 12 for acting on the front end of said clamping plate 22 to effect the clamping of and to release the same. Each plate 24 is slidibly mounted for a limited fore and after movement on the associated operative member 10 in a direction parallel to the tuner base 14. When the pushbutton is pulled, the plate 24 is pulled forward on its operative member to releases the clamping function of the spring plate 22 to the frequency defining plate 16 to provide a state where the position of the engaging pin 20 can be preset. Each spring plate 22 is positioned by a member 48 passing through the same. From this state, when the pushbutton is depressed, the plate 24 causes the spring plate 22 to clamp the frequency defining plate 16 at the rear pressing end 26. According to this arrangement as shown, a guiding plate 28 is attached to the foremost end of the base 14, and a slider 34 coupled to a tuning member (not shown) is slidably mounted through guide holes 30 and 32 provided on both ends of said guiding plate 28, and pins 36 are mounted on this slider 34 with a space corresponding to the distance between the adjacent operative members 10, and each pin 36 is received in a pair of overlapping slots 44 and 46 in a pair of overlapping pivoted links 40 and 42. Each pair of slots 44 and 46 are sufficiently long to cover the maximum tuning core stroke and are respectively provided at the free end portions of the pair of overlapping links involved links 40 and 42, the opposite ends of which are pivotally mounted on the tuner base 14 by a common pivot pin 38 positioned between an adjacent pair of operative members 10. A resilient member, such as a coil spring (not shown), is employed for biasing each operative member 10 back to an inoperative forward position.

The operation of the above described arrangement is now explained: While the frequency defining plates 16 are clamped and restrained on the operative members 10 in a predetermined relationship, when a pushbutton 12 is depressed, the operative member 10 on which it is carried moves rearward so that the pin 20 of the plate 16 carried thereby engages with the inside edge 50 or 52 of one of the associated pair of links 40 and 42 to rotate the thus engaged links 40 or 42 around its pivot pin 38; with either link 40 or 42 being thus rotated, the slider 34 slides either to the right or left in FIG. 1 a distance depending upon the pin position, and accordingly, the other links move slantwise at the same time. Such movements of the links 40 and 42 engaged by the pin 20 associated with the depressed pushbutton are terminated when this pin reaches the 54 of the inside edges of these links where it is in line with the track of the movement of the. As one tries to push the engaging pin 20 forward from this point, one of the links acts as a stopper of the rotational movement of the other link. As the Figures show, the two links 40 and 42 are of the same shape and dimensions. Instead of mounting each operative member in contact with the tuner base as shown in FIG. 2, it may be disposed on top of the two links 40 and 42 so that the frequency defining plate is positioned beneath thereof. In either case, the engaging pin 20 contacts with either of the links 40 and 42 intermediate of the pivotal pin 38 and the pin 36 so as to rotate said links. Since the radius of rotation of the links is large at the point the pin 36 extends into the slots of the links, a relatively large operation stroke of the slider is provided for a relatively small rearward movement of the link-engaging pin 20.

As described above, according to the prior invention not only the operative member but also the frequency defining plate, the spring plate for locking and restraining the same, the lock plate and each of the links are disposed parallel to the tuner base; therefore, the resulting mechanism for tuning operation can be made very thin; for example, a pushbutton type tuner having a thickness of about 10 mm can be designed. In addition, the overall construction can be greatly simplified and its scale made very small because only one engaging pin 20 need be disposed on the frequency defining plate and the links 40 and 42 may be provided with a very compact configuration. Further, a large tuning core stroke obtained by the engaging pin 20 allows the cores to be effectively inserted in and extracted from the coils, and in addition to that, since, as mentioned earlier, one of the two links acts as a stopper of the movement of the other link, a desired state of broadcasting station selection and tuning can invariably be obtained with great accuracy.

According to the arrangement described in FIGS. 1 and 2, the crossed links disposed on both ends of the pushbutton are short, and they are almost perpendicular relative to the direction of movement of the engaging pin disposed on the frequency defining plate, and as a result, it is difficult to smoothly effect tuning operation with pushbuttons. In addition, since the links are required to be positioned closer to the foremost end of the tuner base than that of the engaging pin on the frequency defining plate, failure of the pin to move these links with desired accuracy sometimes occurs.

The embodiment of this invention shown in FIGS. 3 and 4 is an improvement on the arrangement of FIGS. 1 and 2 in that a thin and small-scale tuning mechanism is also capable of providing smooth and accurate operation of broadcasting station selection and tuning by means of the links moved in response to pushing of the pushbuttons.

As FIG. 3 shows operative members 62 each having a pushbutton 64 disposed on the front side of a tuner frame 60. Each operative member 62 is mounted on the tuner base parallel thereto and the individual operative members are disposed close to each other. As easily understood, this arrangement helps design a thin as well as small-scale tuner mechanism. On the foremost end of the operative member 62 is provided a slider 66 so mounted on the frame or base 60 that it is slidable in a direction normal to the moving direction of the operative members 62. Each operative member 62 is also provided with a frequency defining member 70 to the free front end of which is attached an engaging pin 68. The rear end of each frequency defining member 70 is pivotally mounted on the slider 66 by a pivot pin 72 and its free front end is clamped and restrained by a clamp member 74 attached to that portion of the associated operative member 62 which is closer to its pushbutton 64. The clamp member 74, in cooperation with an lock member 76 which slides together with said pushbutton 64 in a longitudinal direction of the operative member 62, engages and disengages the frequency defining member 70. In order to effect tuning operation by sliding the slider 66 by means of the engaging pin 68 of the frequency defining member 70, said slider 66 is provided with a series of pins 78 spaced apart a distance corresponding to the spacing of the operative members 62 a pair of confronting links 80 and 82 are pivotally mounted on the frame base 60 across each operative member 62 so that the associated engaging pin 68 is positioned to engage the inside edges 84 and 86 of these links 80 and 82 (see FIG. 4). Each of the links 80 and 82 bends in the middle to be slightly L-shaped; therefore, those ends of the links which are closer to the pushbuttons extend toward the pushbuttons in such a manner that they are substantially parallel to the operative members 62, and they are fixed by pivotal pins 88 to the frame 60 at positions closer to the pushbuttons than is the associated engaging pin 68. These links 80 and 82 are provided with slots 90 and 92 at their rear ends (i.e. their ends remote from the pushbuttons), and as the Figures. show, they are engaged with the associated pin 78 passing through these slots 90 and 92; as a result, the confronting links 80 and 82 cross at their rear ends.

In the embodiment shown by FIGS. 3 and 4, a rack 96 is extended from one side of the slider 66 as a mechanism for inserting the cores in and extracting them from the corresponding coils 94 by means of said slider 66. A gear 98 engaging with the rack 96 is engaged with a rack 104 of a movable member 102 which is guided by a guiding rod 100 provided on the frame 60; as a consequence of the motion of the slider 66 toward either the left or the right in the Figures, the movable member 102 is made to move in the direction of the movement of the operative member 62, and this movable member 102 carries to the cores to be inserted in or extracted from the coils 94. A coaxial crown gear 106 is horizontally mounted on the gear 98, and this crown gear 106 engages with a pinion gear 110 which can be turned by a manually handled shaft 108 for effecting fine tuning manually.

It is thus clear that, according to the embodiment described above, the tuner can be made very thin. In addition, since the links 80 and 82 are made substantially L-shaped with a bend in the middle, the position where these links are pivotally mounted to the tuner base by the pins 88 can be advantageously closer to the pushbuttons; therefore, it has been made possible to provide a small angle formed by the direction in which each operative member is moved and the crossing point of the inside edges 84 and 86 of the links which are engaged by the engaging pin 68. Such features are combined to provide a very smooth and accurate operation of broadcasting station selection and tuning by means of the control of the pushbutton.

Figure 5:
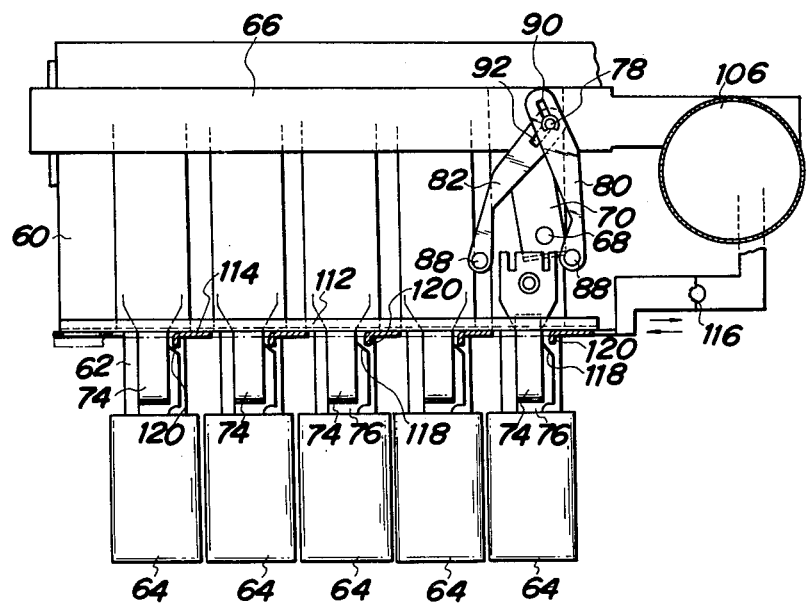
FIG. 5 is a plan view showing a pushbutton tuner with a unique clutch mechanism.
Figure 6:
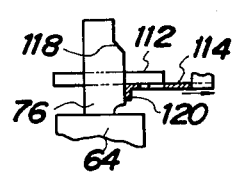
FIG. 6 is an explanation view of the operation of the clutch mechanism in FIG. 5.
Figure 7:
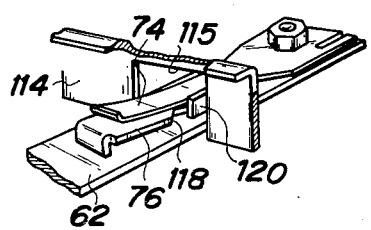
FIG. 7 is a perspective view of only a portion of the clutch mechanism in FIG. 5.

FIGS. 5 to 7 show a clutch control mechanism that can be used with the pushbutton tuner according to this invention, and more particularly, they show a new mechanism which provides a simple and compact control mechanism of a clutch mechanism in the pushbutton tuner for both tuning control system according to the control of the pushbutton and tuning control system according to manual rotational operation and which is capable of shortening the depth of the tuner as well as preventing the operative members from rattling.

In adjusting a pushbutton tuner which is capable of effecting rapid tuning control by the control of the pushbutton, it is essential that a fine tuning of the desired station be made by means of the manual rotational operation of a tuning control shaft. Therefore, at the time the tuning control shaft is controlled by a pushbutton, control over tuning is switched to the pushbutton control system by means of a clutch mechanism. The conventional mechanism for controlling a clutch of this kind is generally disposed farthest away from the pushbuttons. A clutch operating plate is usally rotatably disposed on a rear panel of the tuner frame, and its rotation is controlled by the pushbutton at the front of an operative member. A cam member is rotated following this rotation to thereby effect operation of the clutch. However, the clutch control mechanism of this conventional type requires a large clutch operating plate, and it also requires the space for rotation of said plate at the rear portion of the tuner frame. Accordingly, the depth of the pushbutton tuner becomes inevitably great and its construction complicated.

The clutch mechanism now to be described overcomes these defects. In order to provide a thin tuner, a series of operative members 62 each having a pushbutton 64 are disposed on the base of the frame 60 parallel thereto, and on top of each operative member 62 is disposed a frequency defining member 70, a spring plate 74 for holding and restraining said defining member in place, and a locking member 76 for pushing up the free end of said spring plate 74. The frequency defining member 70 is pivotally mounted on the operative member 62 at one end and is provided with the engaging pin 68 on the opposite end. Links 80 and 82 are pivotally mounted to face each other across the operative member 62, and the foremost ends of these links 80 and 82 are engaged in a forked manner with slots 90 and 93 with respect to a pin 78 vertically disposed on the slider 66 provided slidably on the rear portion of the frame 60. When the operative member 62 is pushed forward, the engaging pin 68 is brought to engagement with either of the links 80 and 82 to thereby move the slider 66. A rack disposed on one end thereof operates the tuning elements (not shown). The front portion of the frame 60 is bent up to form a member through which the operative members 62 are inserted, and a clutch operating plate 114 is slidably disposed along a guide wall 112 for guiding the sliding of the operative member. The clutch operating plate 114, as shown in FIG. 5, extends to the right to be provided with a resilient restoration mechanism 116; it also extends toward the rear portion of the frame so as to reach a clutch forming part under a crown gear 106 which, as conventionally known, is rotated for tuning control by rotational operation of the manual tuning shaft, and said clutch forming part is so controlled as to effcct the above mentioned switching operation. Each locking member 76 has on one side thereof a projecting cam portion 118, which is confronted by an engaging portion 120 of the clutch operating plate 114 disposed along the guide wall 112; The cam portion 118 of each locking member controls the clutch operating plate 114.

According to the embodiment of this invention described above, the clutch control mechanism is provided on the front portion of the tuner frame, so that the depth of the pushbutton tuner of this kind can be shortened sufficiently. In addition, its structure is very simple because the only parts required are first, a cam portion 118 that is formed in each locking member 76 which is essential for the purpose of holding and restraining the associated frequency defining member 70; and second, the engaging portion 120 disposed on the clutch operating plate 114 for engaging with said cam portion. Furthermore, since each operative member 62, both at the time of being pushed forward or returned to the original position, is subject to compression of the resilient restoration mechanism 116 disposed along said clutch operating plate 114, its rattling can be effectively prevented.

In this connection, when an operative member 62 is pushed forward, according to the embodiment described above, the engaging pin 68 acts on either of the links 80 and 82 after the cam portion 118 acts on the engaging portion 120 to thereby control the clutch operating plate 114 for clutching; but when, in order to release the frequency defining member 70 for adjustment, the pushbutton 64 is pulled forward and the locking member 76 is extracted from its locking position so that the frequency defining member 70 is released from restraint, the cam portion 118 retracts beyond the position indicated in FIG. 5; when the pushbutton 64 is then pushed forward, the engaging pin 68 first contacts with the links 80 and 82 which then sets the position of the frequency defining member 70. When the pushbutton is fully pushed-in, the locking member is returned to its locking position.

To obtain accurate broadcasting station selection and tuning through rapid control of the pushbutton in the pushbutton tuner, it is necessary to always guide and operate the operative member in an accurate direction. Conventionally, a rear side panel or guide plate disposed vertically on the rear portion of the tuner frame is provided with operative member guiding holes through which the foremost ends of the operative members extending from the buttons arranged on the front side of the frame are inserted as they are guided for their movement. But such conventional arrangement requires said rear side panel or guide plate to be specially provided. Also the operative member is required to be long enough to reach said rear side panel or guide plate, and a space for receiving projected portion of the operative member after the button is pushed forward is required at the portion behind said rear side panel or the guide plate. As a result, the pushbutton tuner inevitably becomes considerably deep.

Figure 8:
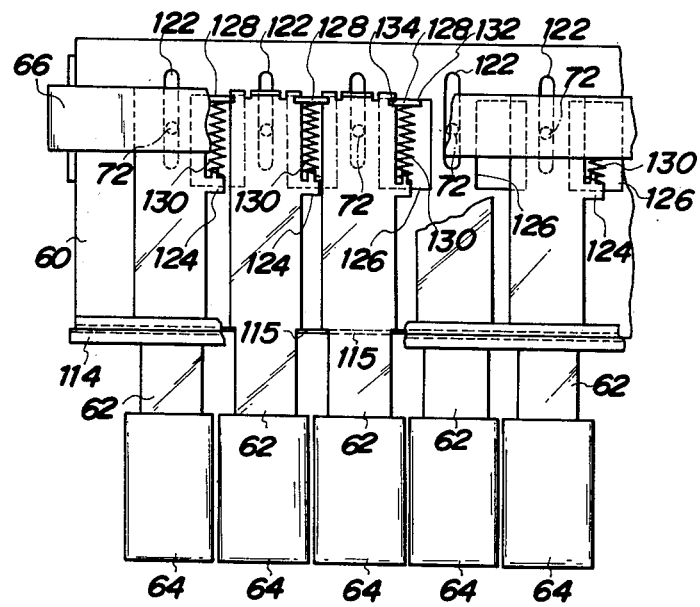
FIG. 8 is a plan view showing a pushbutton tuner with a unique guiding and spring structures for operative members.
Figure 9:
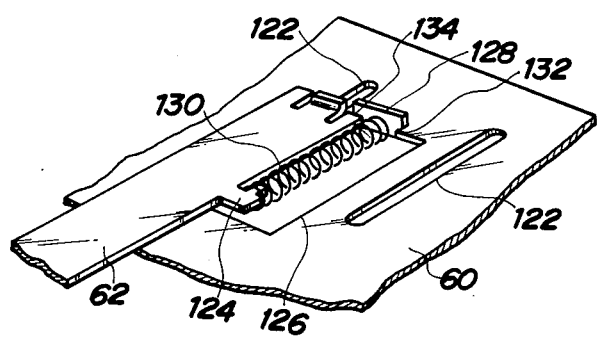
FIG. 9 is a partial perspective view of the tuner in FIG. 8.

FIGS. 8 and 9 show a structure of the pushbutton tuner wherein the defects of the conventional type have been overcome. As FIG. 8 shows, tuner frame 60 is provided with five operative members 62 each of which is equipped with a pushbutton 64. Slots 122 are arranged on the base of the frame 60 in directions of the sliding of the operative members 62, and a pin 72 is formed on the base of each operative member 62 for engaging with each slot 122 (said pin 72 may be positioned under the pin which pivotally supports the above mentioned frequency defining member). The sliding of each operative member 62 is guided by being inserted through a guide portion 115 of a rising portion formed by bending the frame base 60 on its front side. On one lateral side of each operative member 62 is provided an engaging portion 124. On the rear portion of the frame base 60 is formed an opening 126 as well as a rising receptacle 128. A compressed spring 130 disposed between the engaging portion 124 and the receptacle 128 helps the pushbutton return to the original position. In addition, a clutch operating plate 114 for operating a clutch as described is slidably disposed along said rising portion, and, as a result, the clutching operation for switching between station selection controls in accordance with the control of the a pushbutton and the rotation of the tuning shaft can be accomplished.

According to the embodiment described above of this invention, no guide mechanism for guiding the operative member need be provided in the rear portion of the frame of the pushbutton tuner and so the operative member need not be long enough to reach such guide mechanism and no space for receiving a projected portion of the operative members when the pushbuttons are pushed forward is required at the rear of the frame. Consequently, the overall structure of the tuner can be made very compact, especially with a great reduction in its depth. In addition, as indicated in FIG. 8, a cylindrical pin 72 may be provided on each operative member, and so, a reasonable accuracy can be obtained in the guiding and sliding operation of each operative member 62 between the associated cylindrical pin 72 and said slot 122.

Further, since a spring 130 is disposed on one end of the operative member 62, a pressed pushbutton is returned to its starting position while the depth and thickness of the tuner are reduced. Another advantage of such arrangement wherein the spring 130 is disposed on one end of each operative member 62 is that each operative member is always subject to a compressive action of the spring which prevents rattling of the operative member.

As explained above, in order to reduce the thickness of the tuner, the size of the pushbutton tuner should of course be made compact, but at the same time, a tuning mechanism for inserting cores into and extract them from the tuning coils and an indicating control mechanism for indicating the selected broadcasting station should also be compact. As conventionally known, an addition of a separate manual tuning mechanism is required in the pushbutton tuner of this kind for the following two purposes: first, for adjusting and setting of frequencies so that a properly tuned relation is obtained by control of the pushbutton in the manner described above, and secondly, for making the tuner tuned to receive the broadcasting of other channels which are impossible to be tuned to by control of a given number of pushbuttons. According to the conventional system of the manual tuning mechanism, a crown gear which is operatively coupled with a movable plate for controlling the movement of cores is vertically disposed on a lateral side of the tuner frame, said crown gear being engaged with a pinion gear at the foremost end of a manual tuning shaft with its control end being positioned on the front side of the tuner frame. Therefore, the tuner should be thick enough to at least about cover the diameter of the crown gear. The diameter of said crown should be at least 20-25 mm, since those with a smaller diameter fail to provide a smooth to manual tuning control by means of a pinion gear at the end of an even smaller manual tuning shaft. Thus, there has been an unavoidable limitation in designing a very compact tuner.

Figure 10:
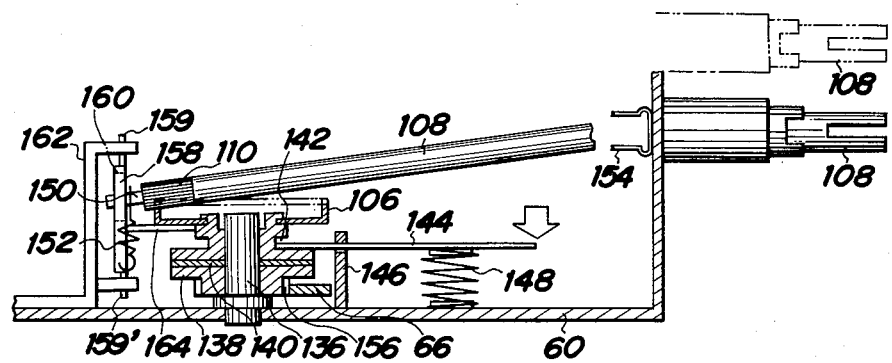
FIGS. 10 and 11 are section views showing in different modes of operation a manual tuning mechanism which may be used for the tuner of this invention.
Figure 11:
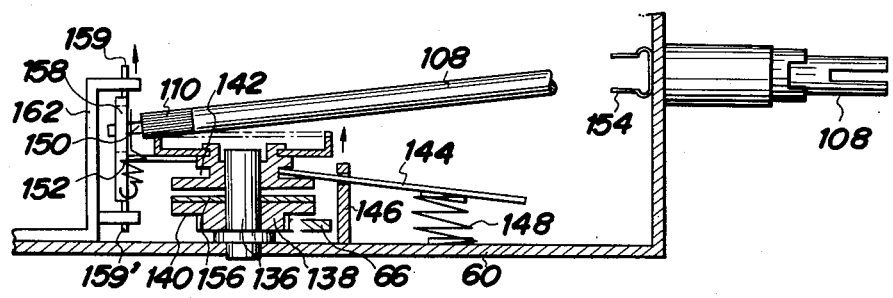
Figure 12:
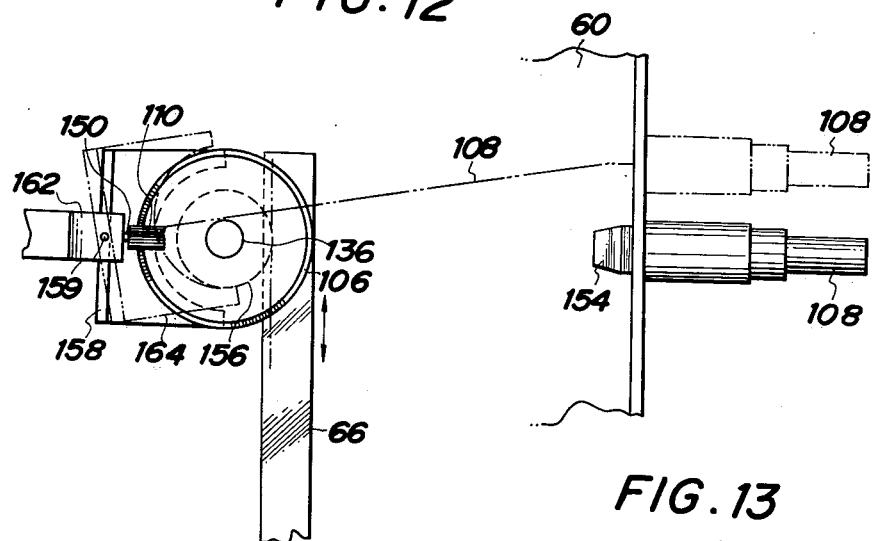
FIG. 12 is a view for use in explaining the operation of the mechanism in FIGS. 10 and 11.
Figure 13:
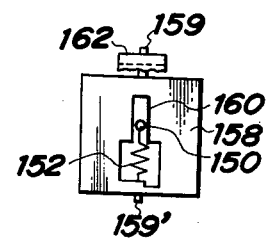
FIG. 13 is a side view of a portion of the mechanism in FIGS. 10 and 11.
Figure 14:
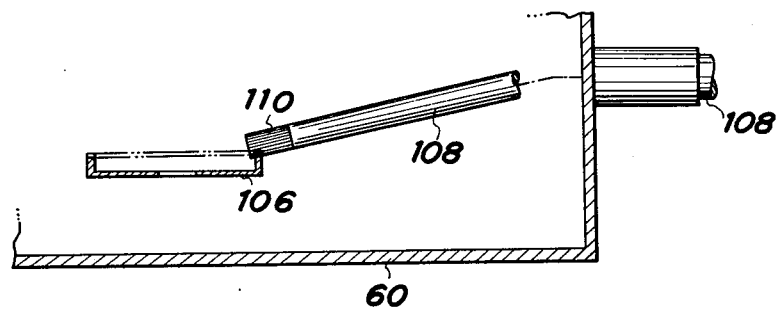

The embodiments which will be described below by reference to FIGS. 10 to 13 solve every problem involved in the prior art system and provide a very compact manual tuning mechanism. As FIGS. 10 and 11 show, a tuner base plate or a corresponding deck 60 is provided with a supporting shaft 136 on which a rotary disk 138 and a crown gear 106 opposite thereto are rotatably mounted. A clutch plate 140 is disposed between the members 106 and 138. In the Figures shown, the clutch plate 140 is mounted on the rotary disc 138, but when desired, it may of course be mounted on the crown gear 106. Such crown gear 106 is also provided with an engaging step 142, with which is engaged the tip of a lever member 144 provided separately on the base 60. Said lever member 144 is supported in the middle by a supporting point member 146 and a resilient material 148 is disposed between the other end of the lever and the base 60 for invariably pressing the crown gear 106 against the rotary disc 138 via the clutch plate 140 so that the crown gear is integrally rotated with said rotary disc 106. At the time of rapid selection of broadcasting stations by means of pressing buttons, a suitable cam or link mechanism, working in a similar manner to such clutch mechanism, applies to the other end of the lever member 144 such a power as to push it down to thereby push up the crown gear and release its engagement with the clutch plate 140. A manual operated shaft 108 is disposed on top of the horizontally disposed crown gear 106 across its diameter; a pinion gear 110 is provided on the forward end of the manual operated shaft 108. On a projection 150 formed on the forward end of the pinion gear 110 is provided a tensile spring 152 for engaging the pinion gear 110 with the crown gear 106. In the prior art system, the pinion gear 110 has been engaged with that point of a crown gear which is closer to the front portion of the tuner frame with the result that the manually operated shaft 108 is considerably shortened; in contrast, according to this invention, the point of engagement is farther backward of the tuner frame, and therefore, the manually operated shaft 108 extends a greater length from the front side of the tuner frame. The other end of the shaft (not engaged) is connected to a tuning operating shaft 108' via a universal joint mounted on the front side of the tuner frame, and by turning, for example, a knob attached to the tuning operating shaft 108', the crown gear 106 is made to rotate to thereby effect a desired fine manual tuning control by way of the clutch plate 140. Tuning control on the primary part of the tuner that makes use of the rotation of the crown gear 106 is effected by a mechanism now to be described. In, Figures shown, the gear portion 156 of the rotary disc 138 that is rotated by way of the clutch plate 140 is allowed to engages with a rack plate 66 of the type shown in FIG. 12, and the movement of the rack plate 66 is controlled to effect said tuning control. Needless to say, such relation of movement is not necessarily limited to the rack plate 66 and rotational operation of a horizontally disposed gear and so forth may also be used.

According to this invention, the forward end of the manually operated shaft 108 is supported by a supporting plate 158 the top and bottom of which is provided with projecting pins 159 and 159', and the supporting plate 158 is provided with a vertical slot 160 for receiving the above mentioned shaft projection 150. The supporting plate 158 is supported rotatably by the pins 159 and 159' relative to a supporting bracket 162 disposed on the base or deck 60. When required, a receptacle 164 may be formed on the supporting plate 158 to let it support the forward end of the crown gear 106.

To repeat the operation according to the above described system of this invention, when the manually operated shaft 108 is rotated, the crown gear 106, the clutch plate 140 and the rotary disc 138 are also rotated so as to provide a manual fine tuning control to the principal part of the tuner. On the other hand, at the time of selecting broadcasting stations by controlling pushbuttons, the lever member 144 is operated against the resilience of the spring 148 so as to release engagement between said clutch plate 140 and the crown gear 106 and effect rapid tuning smoothly. In addition to that, if the position of supporting the manually operated shaft 108 at the front portion of the tuner frame is vertically changed as shown by the virtual line in FIG. 10, the engaging relationship between the pinion gear 110 and the crown gear 106 at the foremost end of the operation shaft 108 undergoes no substantial change, thus invariably providing a proper driving control relationship. On the other hand, if the supporting position changes laterally as indicated by the virtual line in FIG. 12, the desired engagement between the pinion gear 110 and the crown gear 106 is maintained to provide an effective operation between these two members because the shaft 108 is so formed as to have a substantial length and the direction of the supporting plate 158 relative to the supporting bracket 162 is also freely chargeable to form an unstrained supporting relationship between the shaft projection 150 and the vertical slot 160, where control of the manually operated shaft for supporting and tuning can be accomplished smoothly.

According to the system described above of this invention, since the crown gear is disposed horizontally, a limiting factor accompanying the prior art system of the manual tuning mechanism, i.e. the restriction in respect of thickness due to the diameter of the crown gear, has been eliminated to thereby allow designing of a very thin model of said mechanism. Secondly, the pinion gear of the manually operated shaft according to this invention is brought into engagement with the rear portion of the crown gear with a substantial distance from the front portion of the tuner frame; as a result, if the distance between said manually operated shaft and other operative shafts at the front portion of the tuner frame, such as trimmer shaft and volume shaft, or its height relative to these shafts is varied, there will be no strained engagement between said pinion gear and the crown gear, and such arrangement helps provide a desired broadcasting station selection and tuned state common to various mounting applications of the tuner of the present invention.

In addition, the shaft 108 has its projecting end 150 supported in the slot 160 of the supporting plate 158, which in turn rotatably supported on the supporting bracket 162 by the upper and lower pins 159 and 159'; therefore, a stable and unstrained supported condition can invariably be provided for the shaft projecting end 150 regardless of any variations in the direction of mounting the shaft 108.

What is claimed is:

1. In a pushbutton tuner including support means, a plurality of operative means each having a pushbutton connected thereto and positioned on said support means with the associated operative means for similar movement from an inoperative position to an operative position upon depression of the pushbutton, and first tuning means positioned on said support means for movement in a direction transverse to the direction of movement of the operative means, the improvement comprising: linkage means responsive to the depression of any selected one of said pushbuttons for moving said tuning means in said transverse direction a distance which varies with the particular pushbutton which is depressed, said linkage means comprising a pair of somewhat L-shaped links associated with each operative means, each pair of links being supported for pivotal movement about parallel pivot axes spaced apart in a direction parallel to said transverse direction, the free end portions of each pair of links overlapping one another and each having elongated slots receiving a projection extending from said tuning means so that as each pair of links assumes different relative angular positions with respect to the associated pivot points the tuning means has a different corresponding position, and there is associated with each of said operative means adjustable tuning control means for engaging at least one of the confronting edges of the associated pair of links when the associated pushbutton is fully depressed, each of said adjustable control means being lockably adjustable in position in a direction parallel to said transverse direction of movement of said tuning means and so that upon full depression of the associated pushbutton the tuning control means will first engage at least one confronting link edge to pivot the associated links when the pushbutton is partially depressed and upon further depression of the associated pushbutton will slide along the latter edge until it reaches the point of intersection between said confronting edges where further pivotal movement of the links is terminated.

2. The pushbutton tuner of claim 1 wherein the portion of each of said pair of links which is pivoted extend substantially in the direction of movement of the associated operative means, and the free end portions of each pair of links angling toward one another from said pivoted portion of said links.

3. The pushbutton tuner of claim 1 wherein said plurality of operative means are parallel members mounted in juxtaposed relation for parallel rectilinear movement, said pushbutton being secured to the outer ends of said members and said pairs of links being in juxtaposed relation at the inner ends of said members.

4. The pushbutton tuner of claim 3 wherein the adjacent links of adjacent ones of said pairs of links are pivoted to said support means along a common pivot axis.

5. The pushbutton tuner of claim 2, 3 or 4 wherein said tuning control means associated with each operative means projects from a member pivotally mounted upon the associated operative means and is lockable into any adjusted position thereof.

6. The pushbutton tuner of claim 2, 3 or 4 wherein said tuning means is a thin plate-like member whose thin dimension extends in a direction parallel to the direction of movement of said operative means, each of said links is a thin plate-like member in a plane parallel to the plane of said tuning means, and each of said operative means includes a thin plate-like member in a plane parallel to the planes of said tuning means and links, said parallel tuning means, links and operative means being contiguous to form a compact assembly.

7. The pushbutton tuner of claim 1 wherein there is provided manually operable fine tuning means, ultimate tuning means selectively responsive to said first tuning means or manually operable fine tuning means for effecting a tuning operation, clutch means normally interconnecting said manually operable fine tuning means to said ultimate tuning means and including an inclined cam portion on each operative means and cam follower means engageable by each of said cam portions upon depression of a pushbutton for disconnecting said manually operable fine tuning means from said ultimate tuning means and connecting said first tuning means to said ultimate tuning means.

8. The pushbutton tuner of claim 7 wherein said clutch means includes a first rotary clutch member coupled to said ultimate tuning means, a horizontally disposed crown gear rotatably mounted about a vertical axis on said support frame and also supported for bodily vertical movement between a position where it engages said first clutch member to communicate the rotational movement thereof to said ultimate tuning means and a position where said horizontally extending crown gear is decoupled from said first clutch member, said manually operable fine tuning means including a rotary tuning shaft engaging the rear periphery of said crown gear, the rear end of said tuning shaft being pivotally supported for vertical movement while maintaining contact with the rear periphery of said crown gear, to provide a selection of vertical mounting positions for said manually operable means.

9. The pushbutton tuner of claim 8 wherein the rear end portion of said tuning shaft is also mounted for horizontal movement relative to said support frame means so that said manually operable means may have a selection of horizontal positions.

10. The pushbutton tuner of claim 1 wherein said support means includes a horizontally extending support frame which includes a plurality of first guide aperture means formed in vertically extending front portions thereof, the front end portion of each of said operative means is guided for movement by the defining walls of one of said first guide aperture means, one of said support frame and rear end portion of each of said operative means including a second guide aperture means and a projecting portion in other of same entering said second guide aperture means to guide the rear portion of each operative means for fore and aft movement on said support frame.

11. In a pushbutton tuner including a horizontally extending support frame, said support frame including a plurality of first guide aperture means formed in a vertically extending front portion thereof, a plurality of operative means each having a pushbutton connected thereto and horizontally extending through and guided for movement by the defining walls of one of said first guide aperture means, one of said support frame and rear end portion of each of said operative means including a second guide aperture means and a projecting portion in other of same entering said second guide aperture means to guide the rear portion of each operative means for fore and aft movement on said support frame.

12. The pushbutton tuner of claim 11 wherein there is provided laterally opposite the rear portion of each operative means spring means which extends between a portion of the associated operative means and a portion of said support frame means for urging the associated operative means forwardly.

* * * * *